(12) United States Patent
Yen et al.

(10) Patent No.: US 8,040,180 B2
(45) Date of Patent: Oct. 18, 2011

(54) OPERATIONAL AMPLIFIER CAPABLE OF COMPENSATING OFFSET VOLTAGE

(75) Inventors: Chih-Jen Yen, Hsinchu (TW); Chih-Yuan Hsieh, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 906 days.

(21) Appl. No.: 11/773,945

(22) Filed: Jul. 5, 2007

(65) Prior Publication Data

US 2008/0224768 A1 Sep. 18, 2008

(30) Foreign Application Priority Data

Mar. 14, 2007 (TW) .............................. 96108743 A

(51) Int. Cl.
*H03F 3/38* (2006.01)
(52) U.S. Cl. ....... 330/10; 330/251; 330/207 A; 375/238; 381/120; 381/121
(58) Field of Classification Search .................. 330/310, 330/258
See application file for complete search history.

(56) References Cited

U.S. PATENT DOCUMENTS

| 5,917,378 | A | 6/1999 | Juang |
| 6,166,596 | A * | 12/2000 | Higashiyama et al. .......... 330/10 |
| 6,388,521 | B1 | 5/2002 | Henry |
| 7,239,200 | B2 * | 7/2007 | Ishii et al. ....................... 330/10 |
| 7,268,624 | B2 * | 9/2007 | Chen et al. .................... 330/258 |

OTHER PUBLICATIONS

Holt "Electronic cirucits digitial and analog" p. 422 John Wiley and Sons copyright 1978.*

* cited by examiner

*Primary Examiner* — Michael B Shingleton
(74) *Attorney, Agent, or Firm* — Winston Hsu; Scott Margo

(57) ABSTRACT

An operational amplifier capable of compensating offset voltage includes an input stage circuit having a positive input end, a negative input end, a first current output end, and a second current output end, for outputting current corresponding to voltage received by the positive and negative input ends, an output stage circuit coupled to the first current output end and the second current output end of the input stage circuit, for outputting voltage according to current outputted from the first current output end and the second current output end, and a trimming device coupled between the input stage circuit and the output stage circuit, for adjusting current of the first current output end or the second current output end for compensating offset voltage.

23 Claims, 11 Drawing Sheets

70

OPERATIONAL AMPLIFIER CAPABLE OF COMPENSATING OFFSET VOLTAGE

BACKGROUND OF THE INVENTION

1. Field of the Invention

The present invention is related to an operational amplifier capable of compensating offset voltage, and more particularly, to an operational amplifier compensating offset voltage through adjusting currents between an input stage circuit and an output stage circuit of an operational amplifier.

2. Description of the Prior Art

An operational amplifier is an important component of all kinds of electronic devices, and is widely used in home appliances, industrial fields, scientific instruments, etc. Circuit designers usually use operational amplifiers for different operations, such as buffers, filters, analog to digital converters, etc.

An ideal operational amplifier has the following characters: infinite input impedance, zero output impedance, infinite open loop gain, infinite common mode rejection ratio, infinite frequency bandwidth. However, due to limitations of semiconductor processes and integrated circuit techniques, there are difficulties in realizing an ideal operational amplifier. In order to present properties of a real operational amplifier, an offset voltage is used for representing the non-ideal effects in the prior art.

Please refer to FIG. 1, which illustrates a schematic diagram of a prior art operational amplifier 10. The operational amplifier 10 comprises an input stage circuit 100, an output stage circuit 102, and an equivalent voltage source 104. The operational amplifier 10 receives differential signals from a positive input end Vp and a negative input end Vn, and outputs an amplified result from an output end Vo. The equivalent voltage source 104 represents non-ideal effects of the operational amplifier 10 (which does not exist in the actual circuit), a generated voltage Vos represents the voltage difference between the output end Vo and the positive input end Vp when the output end Vo is coupled to the negative input end Vn (forming a unit gain feedback structure), namely an offset voltage of the operational amplifier 10. Many reasons cause offset voltage, such as physical properties of semiconductors, flaws during process, component mismatches, etc.

Please refer to FIG. 2, which illustrates a schematic diagram of the input stage circuit 100 shown in FIG. 1. The input stage circuit 100 generates currents Id1 and Id2 to the output stage circuit 102 according to the positive input end voltage Vp and the negative input end voltage Vn, and includes input transistors P1, P2 and a current source 200. The input transistors P1 and P2 are both p-type metal oxide semiconductor (MOS) transistors forming a common-source differential pair with a common mode voltage Vc. Under ideal conditions, properties such as channel lengths or channel widths of the input transistors P1 and P2 are identical, so a current Ib generated by the current source 200 will drift into the sources of the input transistors P1 and P2 evenly, making source-to-gate voltages of the input transistors P1 and P2 identical, which means that the voltage Vos equals 0, and the currents Id1 and Id2 are identical. However, in practice, the input transistors P1 and P2 do not match perfectly due to processing properties, so that threshold voltages of the input transistors P1 and P2 are not the same. In such situation, the source-to-gate voltages of the input transistors P1 and P2 are not identical, so that the offset voltage Vos does not equal 0, and the currents Id1 and Id2 are not identical.

Briefly speaking, due to physical properties of semiconductors, flaws during process, component mismatches, etc, the offset voltage of the prior art operational amplifier does not equal 0, and has an effect on the performance. Therefore, decreasing the operational amplifier offset voltage effect became one of the tasks in this art.

SUMMARY OF THE INVENTION

It is therefore a primary objective of the claimed invention to provide an operational amplifier capable of compensating offset voltage.

The present invention discloses an operational amplifier capable of compensating offset voltage, which comprises an input stage circuit comprising a positive input end, a negative input end, a first current output end, and a second current output end, for outputting currents from the first current output end and the second current output end according to voltage received from the positive input end and the negative input end, an output stage circuit coupled to the first current output and the second current output, for outputting voltage according to the currents outputted from the first current output end and the second current output end, and a trimming device coupled between the input stage circuit and the output stage circuit, for adjusting the currents of the first current output end and the second current output end, so as to compensate offset voltage.

The present invention further discloses a rail to rail operational amplifier capable of compensating offset voltage, which comprises an input stage circuit comprising a positive input end, a negative input end, a first current output end, a second current output end, a first current reception end, and a second current reception end according to voltages received by the positive input end and the negative input end, for outputting currents through the first current output end and the second current output end, and for receiving currents through the first current reception end and the second current reception end according to voltages received by the positive input end and the negative input end, an output stage circuit coupled to the first current output end, the second current output end, the first current reception end, and the second current reception end, for generating voltage according to current of the first current output end, the second current output end, the first current reception end or the second current reception end, and a trimming device coupled between the input stage circuit and the output stage circuit, for adjusting the current outputted from the first current output end or the second current output end and the current received by the first current reception end or the second current reception end, so as to compensate offset voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
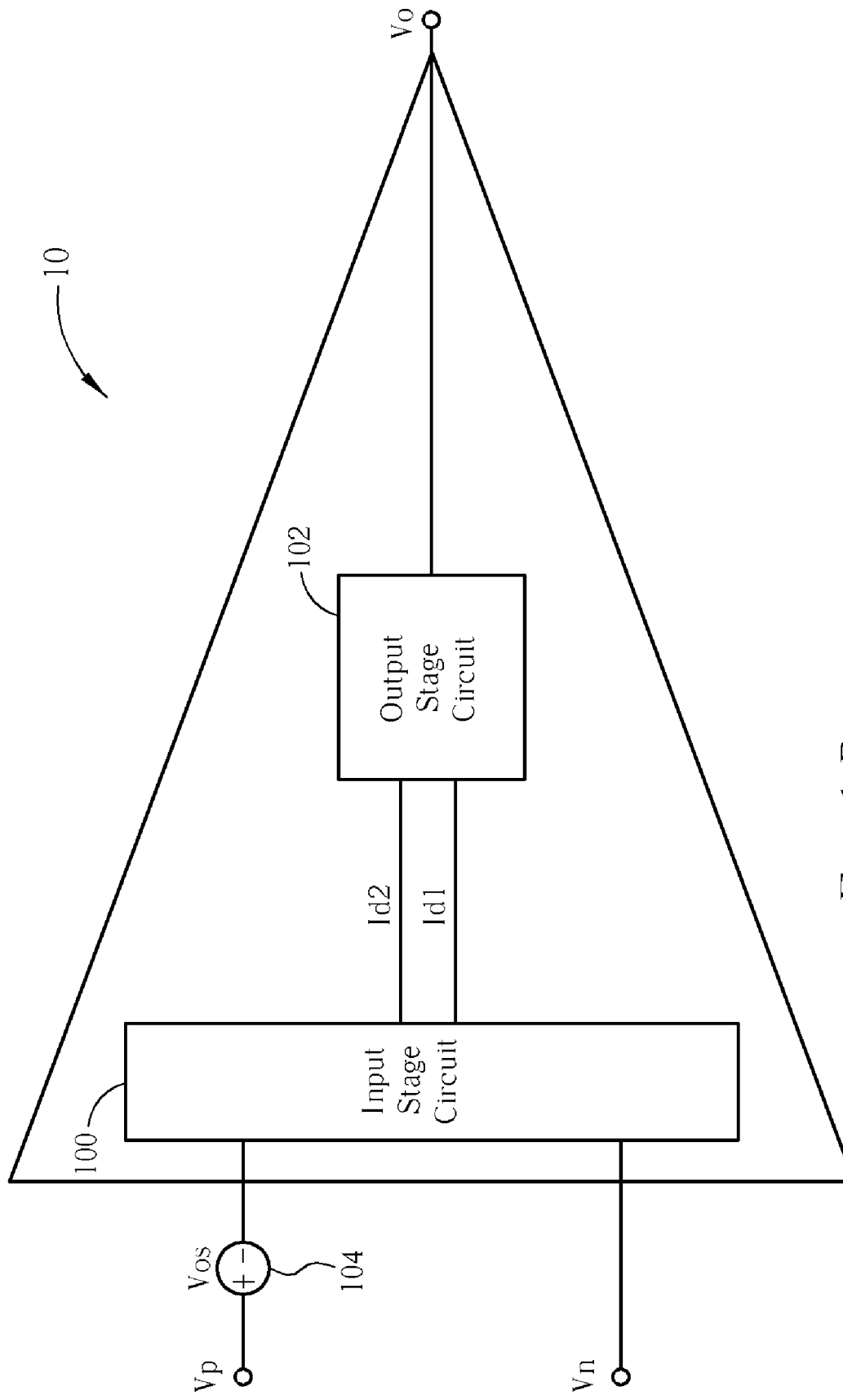
FIG. 1 illustrates a schematic diagram of a prior art operational amplifier 10.
Figure 2:
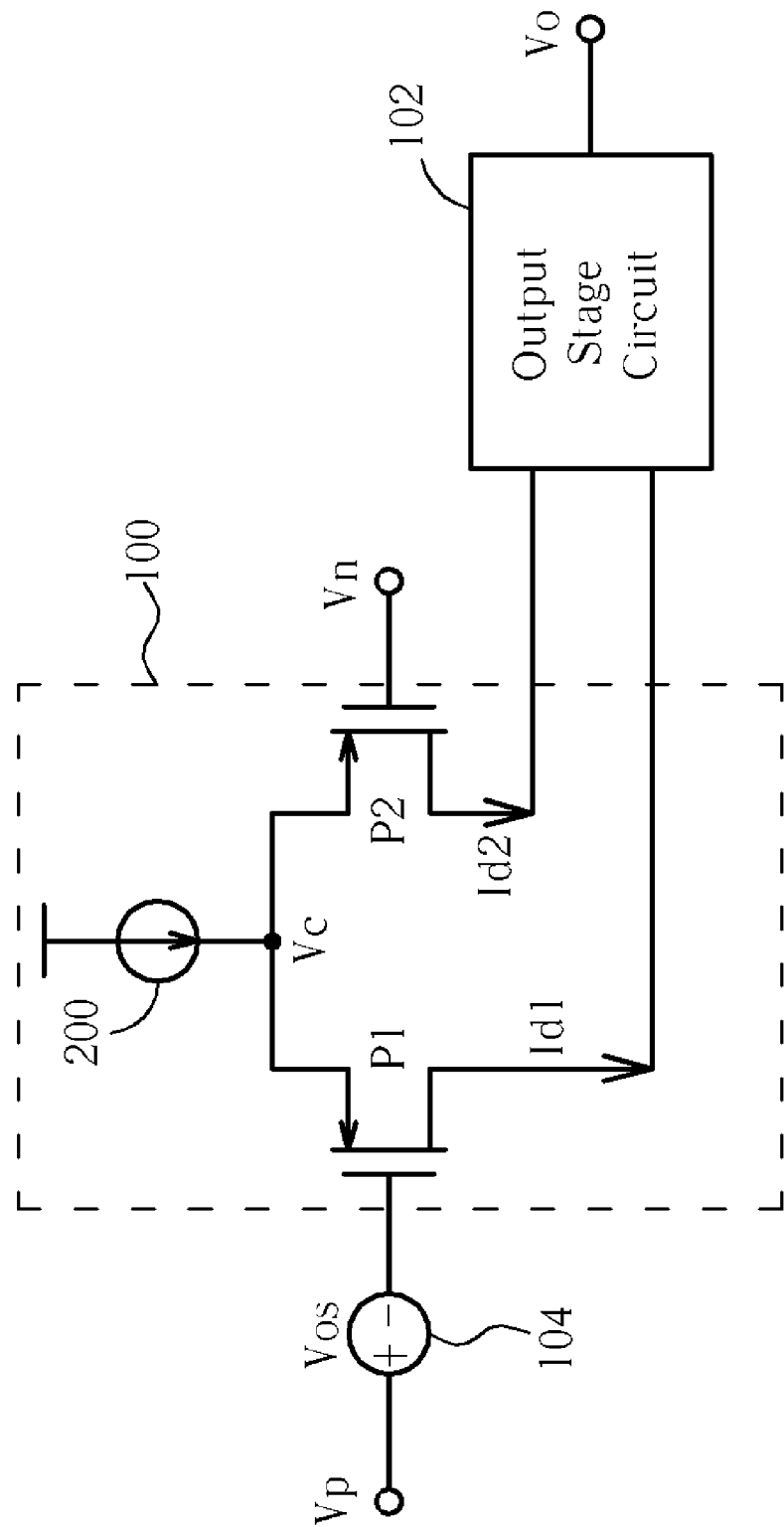
FIG. 2 illustrates a schematic diagram of the input stage circuit shown in FIG. 1.
Figure 3:
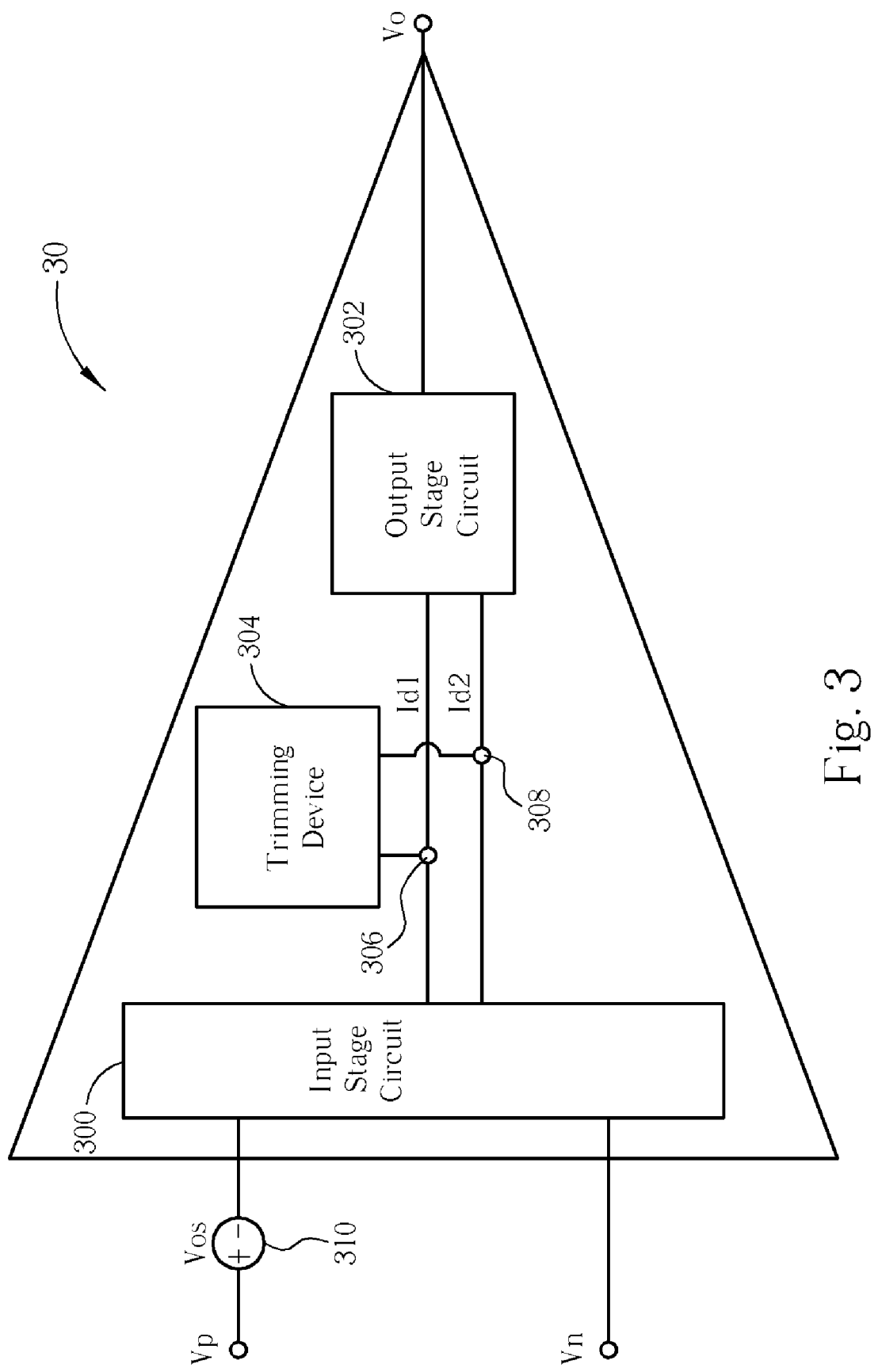
FIG. 3 illustrates a schematic diagram of an operational amplifier capable of compensating offset voltage according to an embodiment of the present invention.

Please refer to FIG. 3, which illustrates a schematic diagram of an operational amplifier 30 capable of compensating offset voltage according to an embodiment of the present invention. The operational amplifier 30 comprises an input stage circuit 300, an output stage circuit 302, and a trimming device 304. After the input stage circuit 300 receives voltage signals through a positive input end Vp and a negative input end Vn, the input stage circuit 300 outputs corresponding currents Id1 and Id2 to the output stage circuit 302 through a first current output end 306 and a second current output end 308. The output stage circuit 302 outputs amplified voltage through an output end Vo according to the currents Id1 and Id2 of the first current output ends 306 and the second current output end 308. Furthermore, in FIG. 3, an equivalent voltage source 310 (which does not exist in actual circuits) represents the non-ideal effects of the operational amplifier 30, and a generated voltage Vos represents the offset voltage of the operational amplifier 30. The trimming device 304 is used for adjusting the currents Id1 and Id2, in order to compensate the offset voltage.

The trimming device 304 of the operational amplifier 30 can compensate the offset voltage caused by physical properties of semiconductors, flaws during process, component mismatches, etc, through adjusting the currents Id1 and Id2. For example, if the current Id1 is greater than the current Id2, the trimming device 304 can draw current from the first current output end 306 or output current to the second current output end 308, to make the current Id1 approximately equal to the current Id2. Oppositely, when the current Id1 is smaller than the current Id2, the trimming device 304 can output current to the first current output end 306 or draw current from the second current output end 308, to make the current Id1 approximately equal to the current Id2. Under this circumstance, even if the operational amplifier 30 generates an offset voltage caused by physical properties of semiconductors, flaws during process, component mismatches, etc, the present invention can compensate the offset voltage through the trimming device 304 without changing designs of the input stage circuit 300 and the output stage circuit 302.

Figure 4:
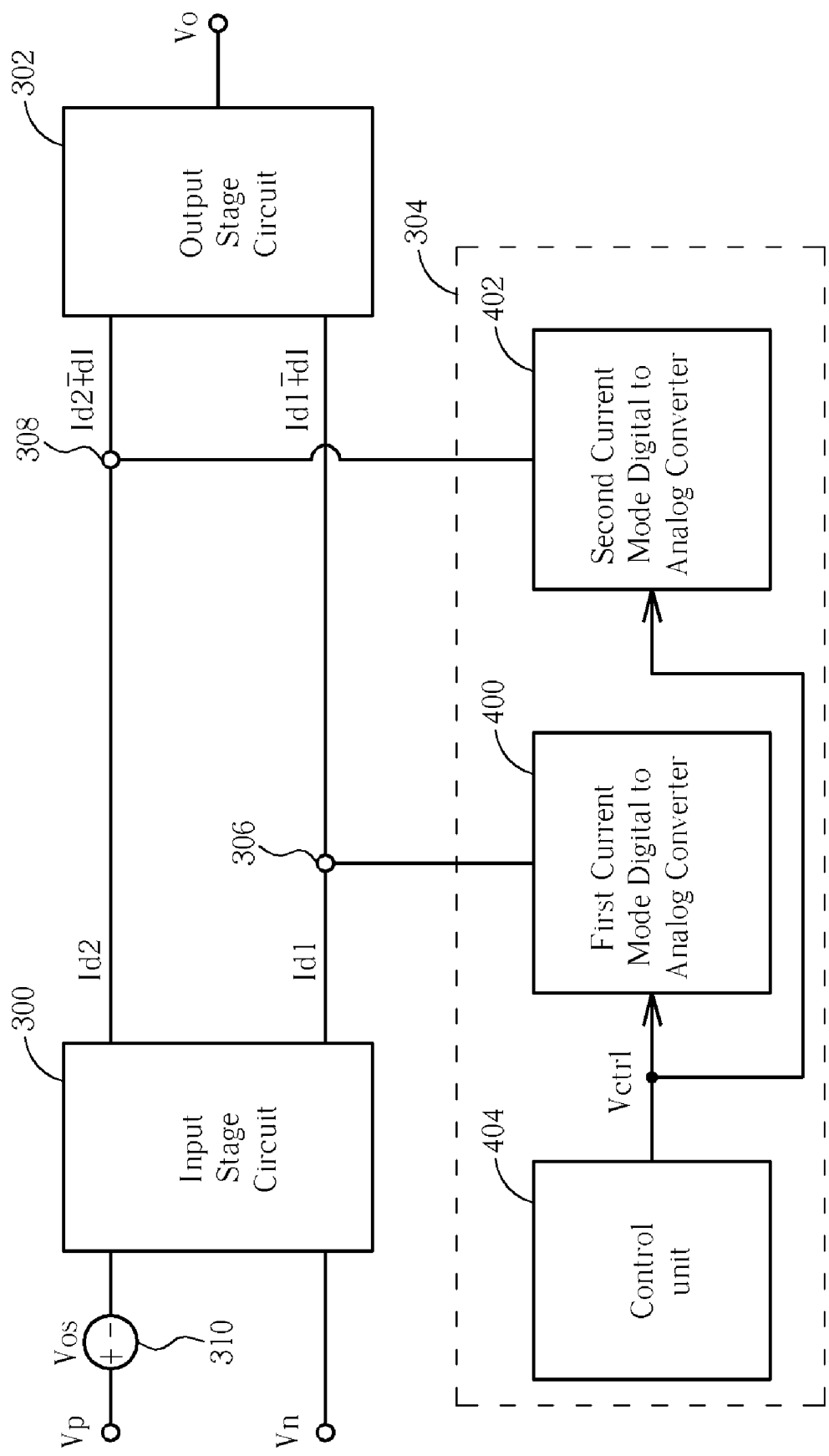
FIG. 4 illustrates a block diagram of the trimming device shown in FIG. 3.

Please refer to FIG. 4, which illustrates a block diagram of the trimming device 304 shown in FIG. 3. The trimming device 304 comprises a first current mode digital to analog converter (DAC) 400, a second current mode DAC 402 and a control unit 404. The first current mode DAC 400 and the second current mode DAC 402 respectively are coupled to the first current output end 306 and the second current output end 308, and utilized for outputting or receiving current through the first current output end 306 and the second current output end 308, according to the control signal Vctrl outputted from the control unit 404. The control unit 404 can output the control signal Vctrl according to the current difference of the first current output end 306 and the second current output end 308, so as to control a current amount outputted or received by the first current mode DAC 400 through the first current output end 306, and to control a current amount outputted or received by the second current mode DAC 402 through the second current output end 308. Therefore, when the currents Id1 and Id2 are not identical due to the offset voltage of the operational amplifier 30, the control unit 404 can control the first current mode DAC 400 and the second current mode DAC 402 through the control signal Vctrl, to adjust the current inputted to the output stage circuit 302, making the current (Id1±d1) and (Id2±d1) identical. As a result, the offset voltage effect is compensated effectively.

Figure 5:
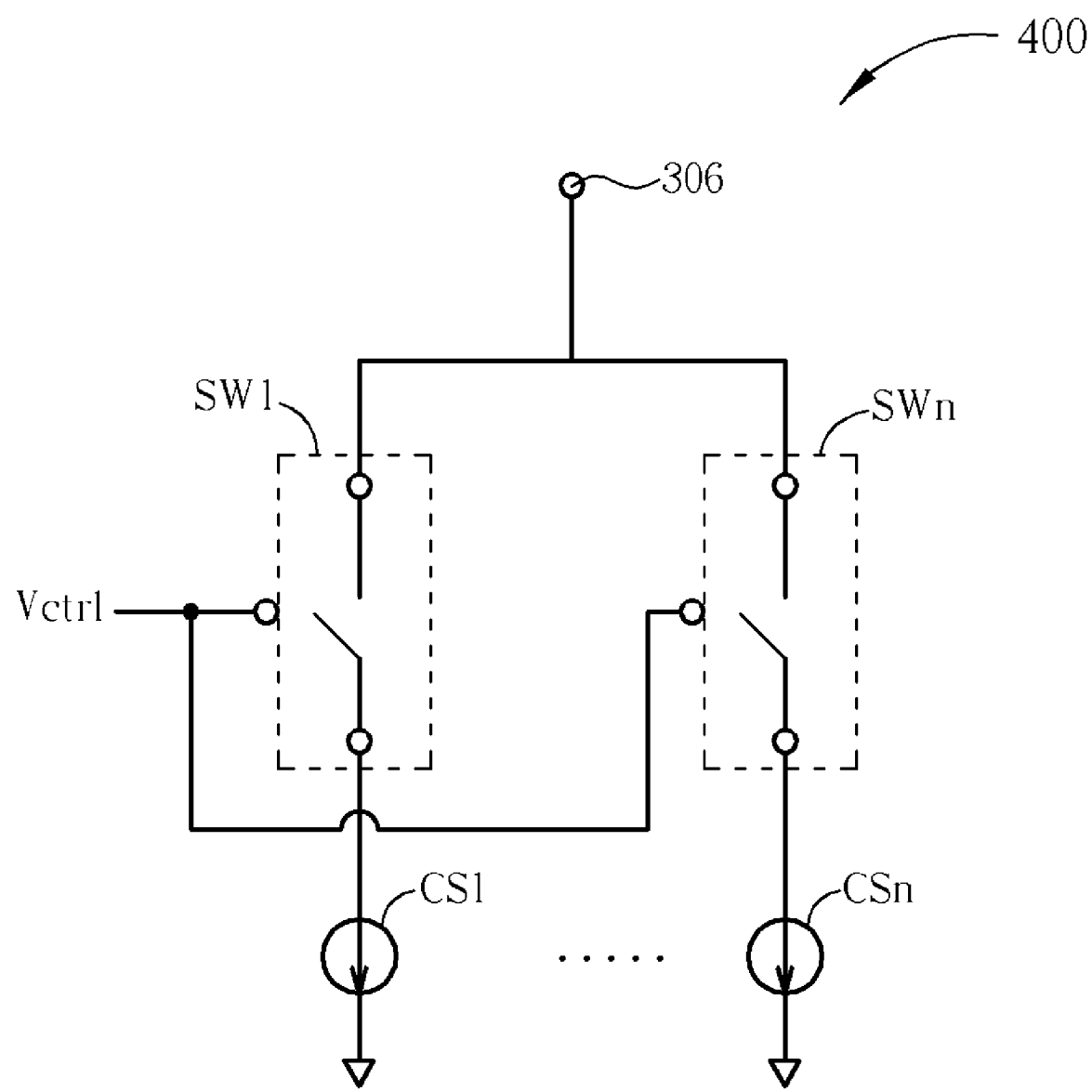
FIG. 5 illustrates a schematic diagram of the first current mode digital to analog converter shown in FIG. 4.

Note that, the trimming device 304 shown in FIG. 4 is an exemplary embodiment, and those skilled in the art can make modifications accordingly. For example, as shown in FIG. 5, the first current mode DAC 400 can be composed of switches SW1~SWn and current sources CS1~CSn. Each of the switches SW1~SWn can conduct connection between the first current output end 306 and a corresponding current source according to the control signal Vctrl, so as to adjust the current amount drawn or outputted through the first current output end 306. Therefore, when the currents Id1 and Id2 are not identical, the control unit 404 can control switches SW1~SWn, and conduct connection between a current source of the current sources CS1~CSn and the first current output end 306, to make the currents Id1 and Id2 equivalent.

Therefore, in the operational amplifier 30, the trimming device 304 can adjust the currents Id1 and Id2, to make currents drifting into the output stage circuit 302 identical and compensate the offset voltage. Certainly, those skilled in the art can design any appropriate trimming device based on requirements. For example, please refer to FIG. 6 and FIG. 7, which illustrate schematic diagrams of operational amplifiers 60 and 70 according to embodiments of the present invention. The operational amplifiers 60 and 70 both derive from the operational amplifier 30, where an input stage circuit 600 of the operational amplifier 60 is composed of p-type MOS transistors P1 and P2, and an input stage circuit 700 of the operational amplifier 70 is composed of n-type MOS transistors N1 and N2, and trimming units 606 and 706 of the operational amplifiers 60 and 70 are designed according to the first current mode DAC 400 shown in FIG. 5. Operations of the operational amplifiers 60 and 70 are similar to the operational amplifier 30. Take the operational amplifier 60 for example. When some properties of the transistors P1 and P2 do not match perfectly, the threshold voltages of the transistors P1 and P2 are not identical, which causes the currents Id1 and Id2 to be unequal. Under this condition, the trimming unit 606 can make the currents Id1 and Id2 to approach equality through turning on the current source.

Figure 6:
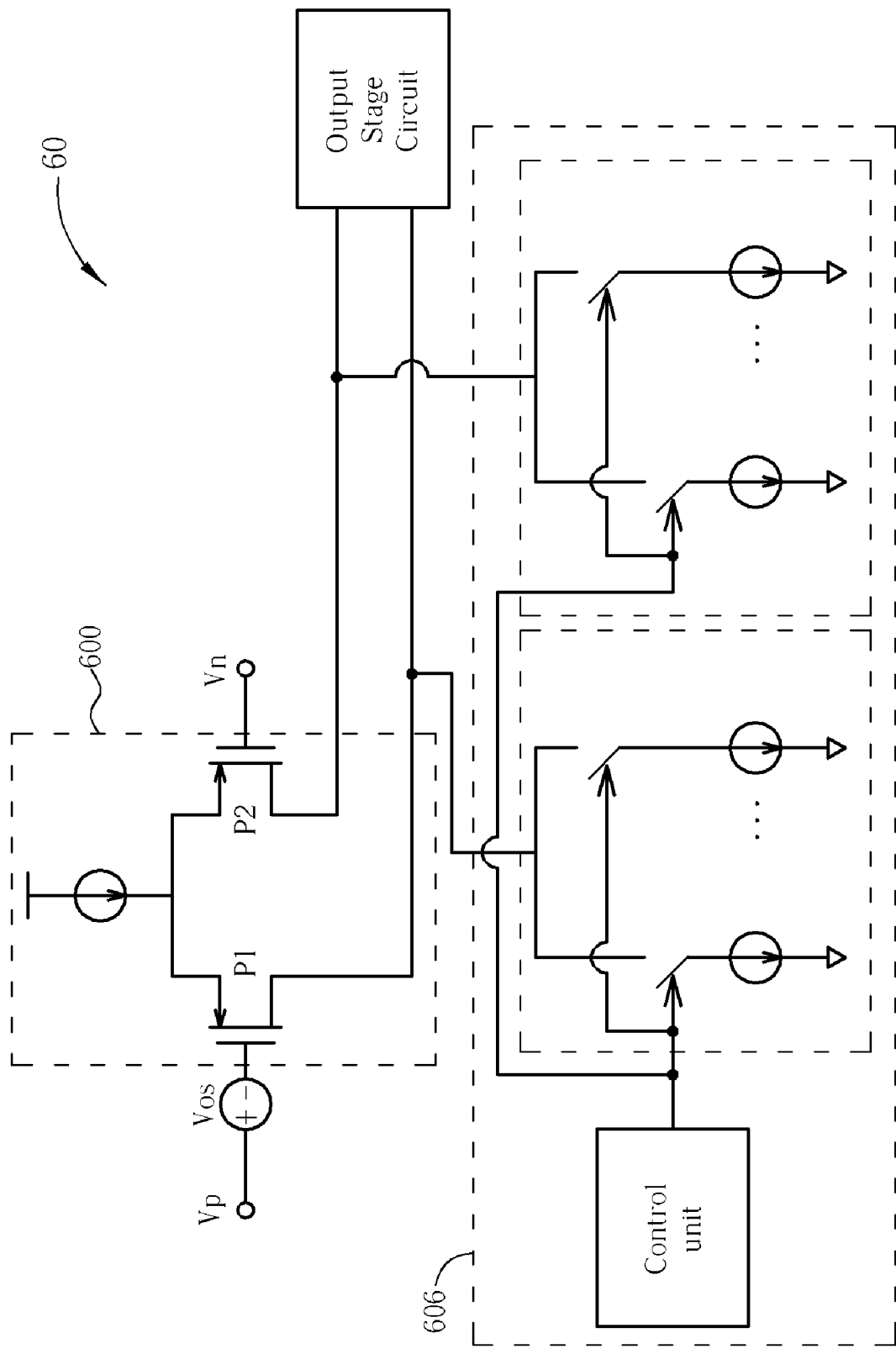
FIG. 6 and FIG. 7 illustrate schematic diagrams of operational amplifiers according to embodiments of the present invention.
Figure 7:
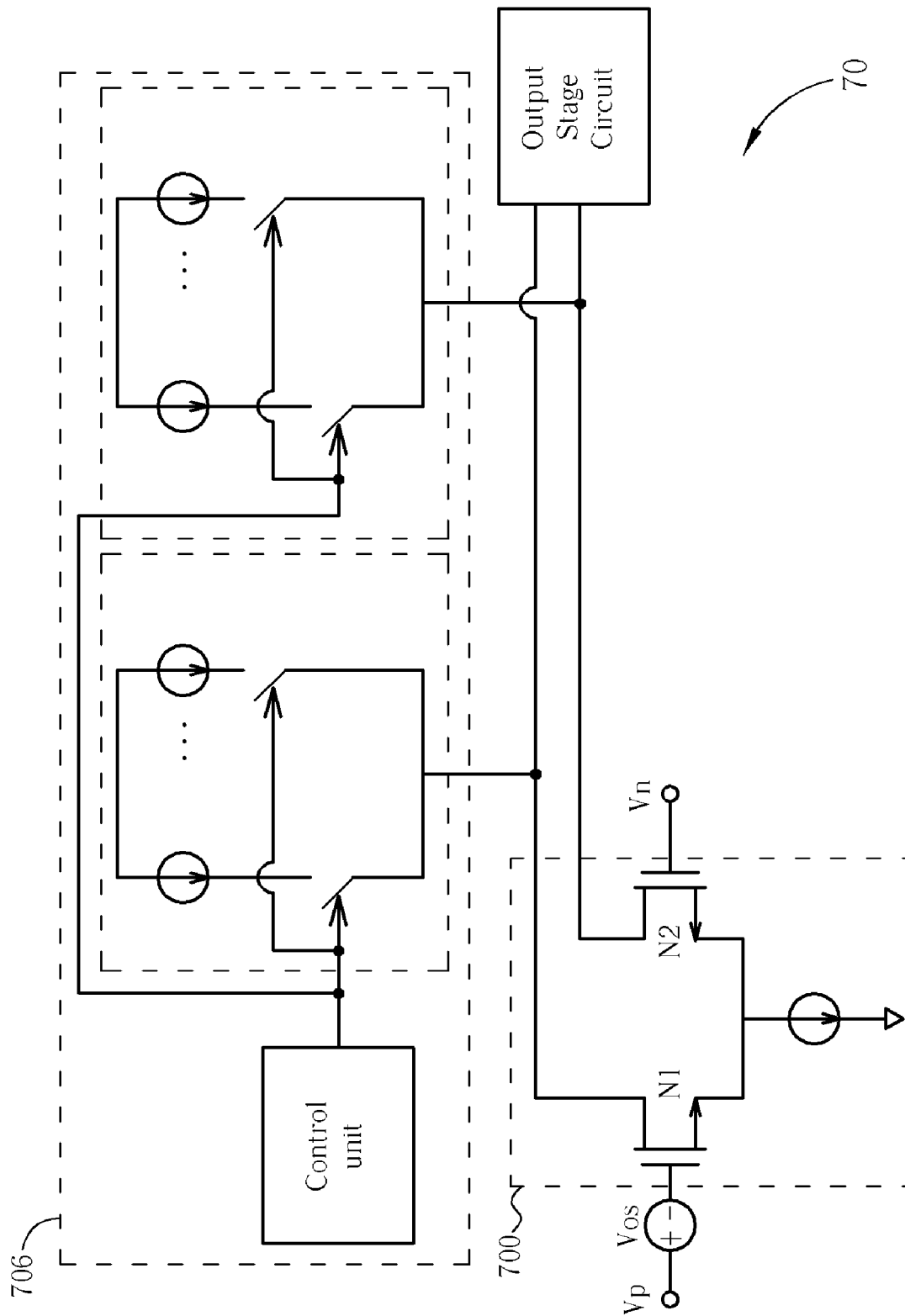

The operational amplifiers 60 and 70 shown in FIG. 6 and FIG. 7 are embodiments derived from the operational amplifier 30, but not for restricting the present invention. Designers may make appropriate modifications. For instance, the amount of the current sources in the trimming units 606 and 706 can be adjusted according to the required accuracy, and currents generated by each current source can be set as identical or step decreasing.

Figure 8:
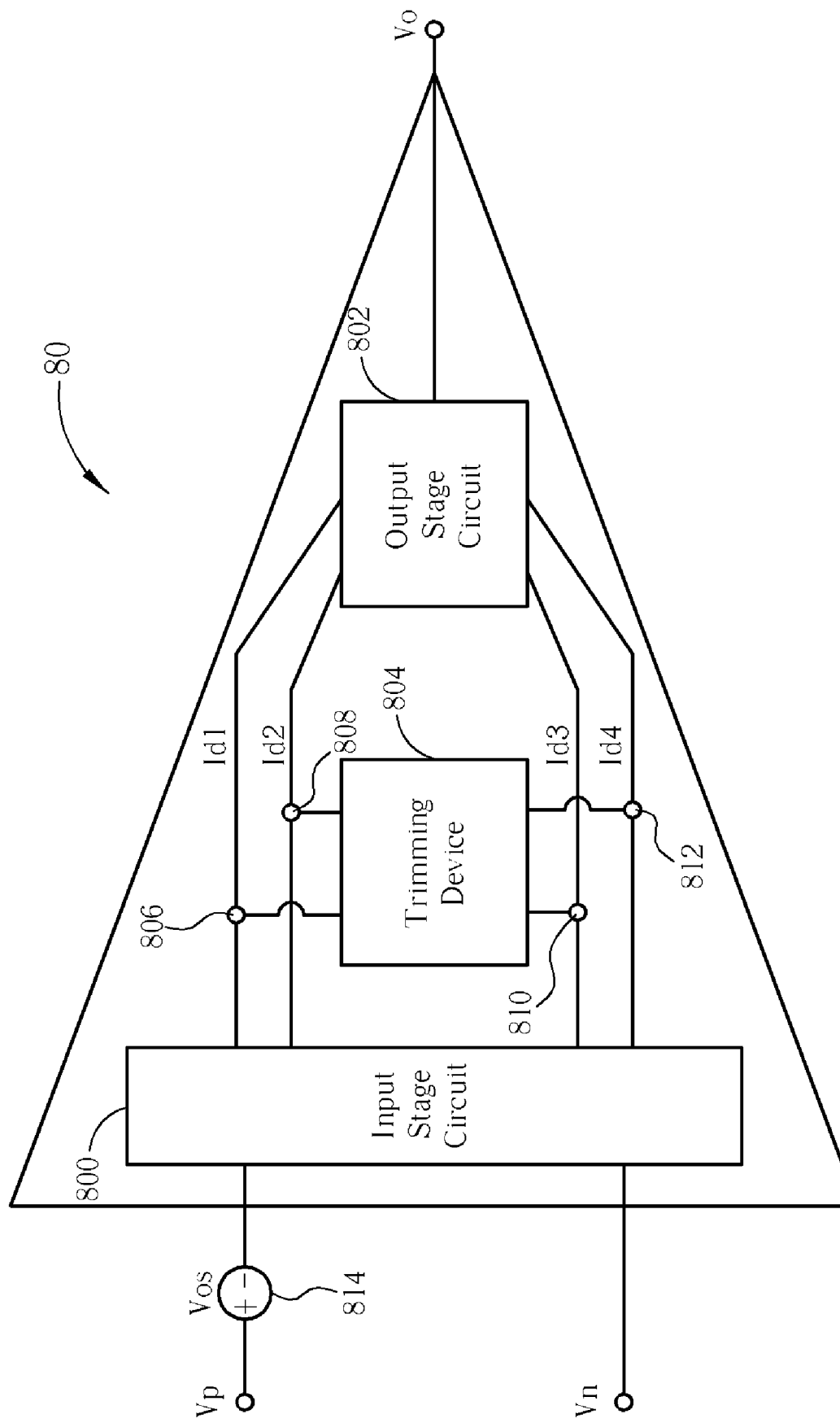
FIG. 8 illustrates a schematic diagram of a rail to rail operational amplifier capable of compensating offset voltage according to an embodiment of the present invention.

Furthermore, for rail to rail operational amplifiers, the present invention provides another embodiment for compensating offset voltage effects in the rail to rail operational amplifiers. Please refer to FIG. 8, which illustrates a schematic diagram of a rail to rail operational amplifier 80 capable of compensating offset voltage according to the embodiment of the present invention. The rail to rail operational amplifier 80 comprises an input stage circuit 800, an output stage circuit 802, and a trimming device 804. After the input stage circuit 800 receives a voltage signal from a positive input end Vp and a negative input end Vn, the input stage circuit 800 outputs corresponding currents Id1 and Id2 to the output stage circuit 802 through a first current output end 806 and a second current output end 808, and receives currents Id3 and Id4 outputted from the output stage circuit 802 through a first current reception end 810 and a second current reception end 812. The output stage circuit 802 outputs amplified voltage from an output end Vo according to the currents Id1, Id2, Id3 or Id4 of the first current output end 806, the second current output end 808, the first current reception end 810 and the second current reception end 812. In addition, in FIG. 8, an equivalent voltage source 814 (which does not exist in the actual circuit) is used to show the non-ideal effects of the rail to rail operational amplifier 80, and a generated voltage Vos represents the offset voltage of the rail to rail operational amplifier 80. The trimming device 804 is used for adjusting the currents Id1 and Id2 outputted by the first current output end 806 and the second current output end 808, or for adjusting the currents Id3 and Id4 received by the first current reception end 810 and the second current reception end 812, so as to compensate offset voltage effects.

The operation principle of the rail to rail operational amplifier 80 is similar to that of the operational amplifier 30, but the rail to rail operational amplifier 80 further comprises the first current reception end 810 and the second current reception end 812, utilized for receiving the currents Id3 and Id4 from the output stage circuit 802. Therefore, after properly modifying the operational amplifier 30, the offset voltage of the rail to rail operational amplifier 80 can be compensated.

Figure 9:
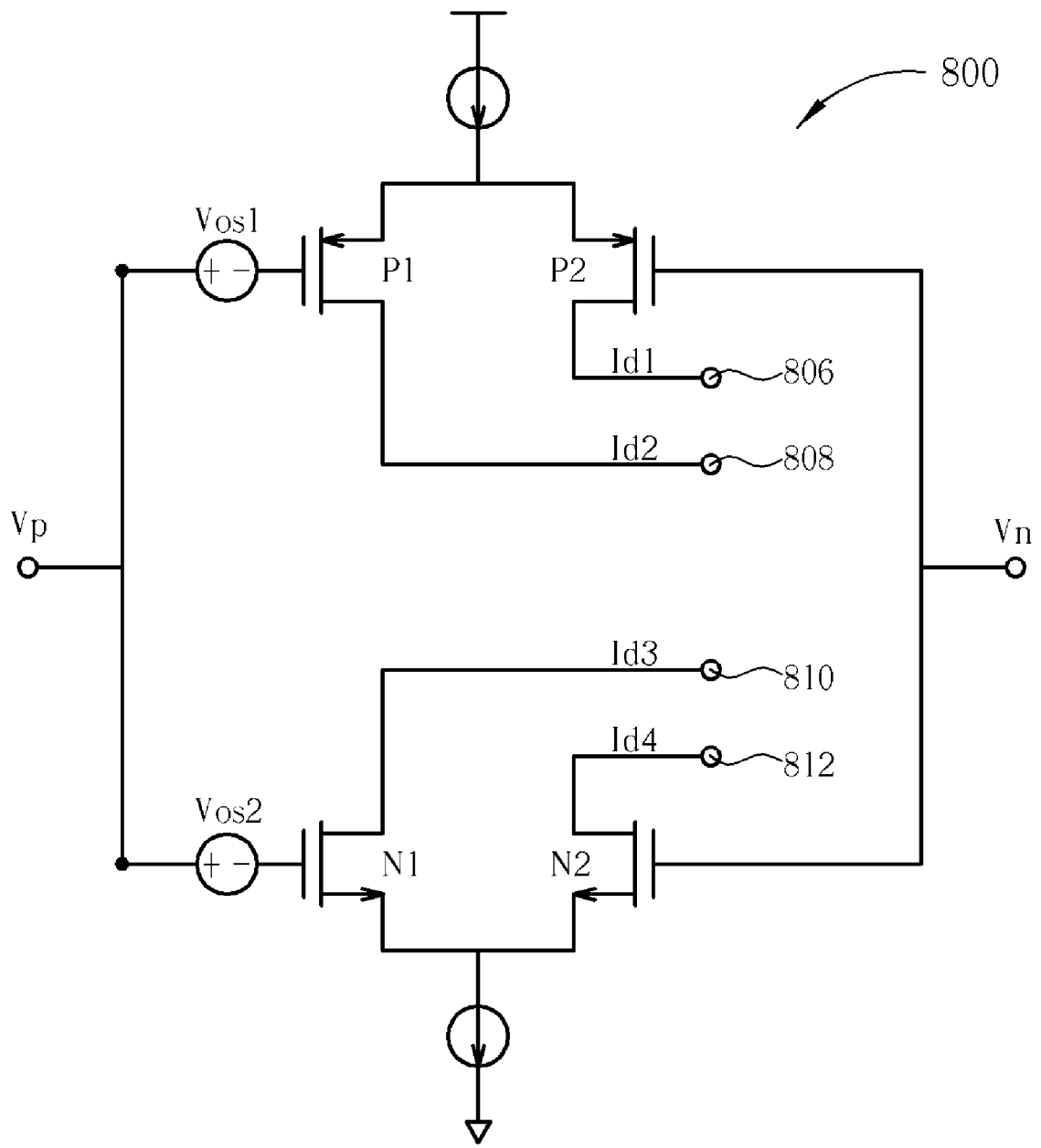
FIG. 9 illustrates a schematic diagram of the input stage circuit shown in FIG. 8.

Firstly, please refer to FIG. 9, which illustrates a schematic diagram of the input stage circuit 800. The input stage circuit 800 comprises differential pairs formed by p-type MOS transistors P1 and P2, and differential pairs formed by n-type MOS transistors N1 and N2. The differential pairs formed by the transistors P1 and P2 can output the currents Id1 and Id2 to the output stage circuit 802 through the first current output end 806 and the second current output end 808, and the differential pairs formed by the transistors N1 and N2 receives the currents Id3 and Id4 from the output stage circuit 802 through the first current reception end 810 and the second current reception end 812.

Figure 10:
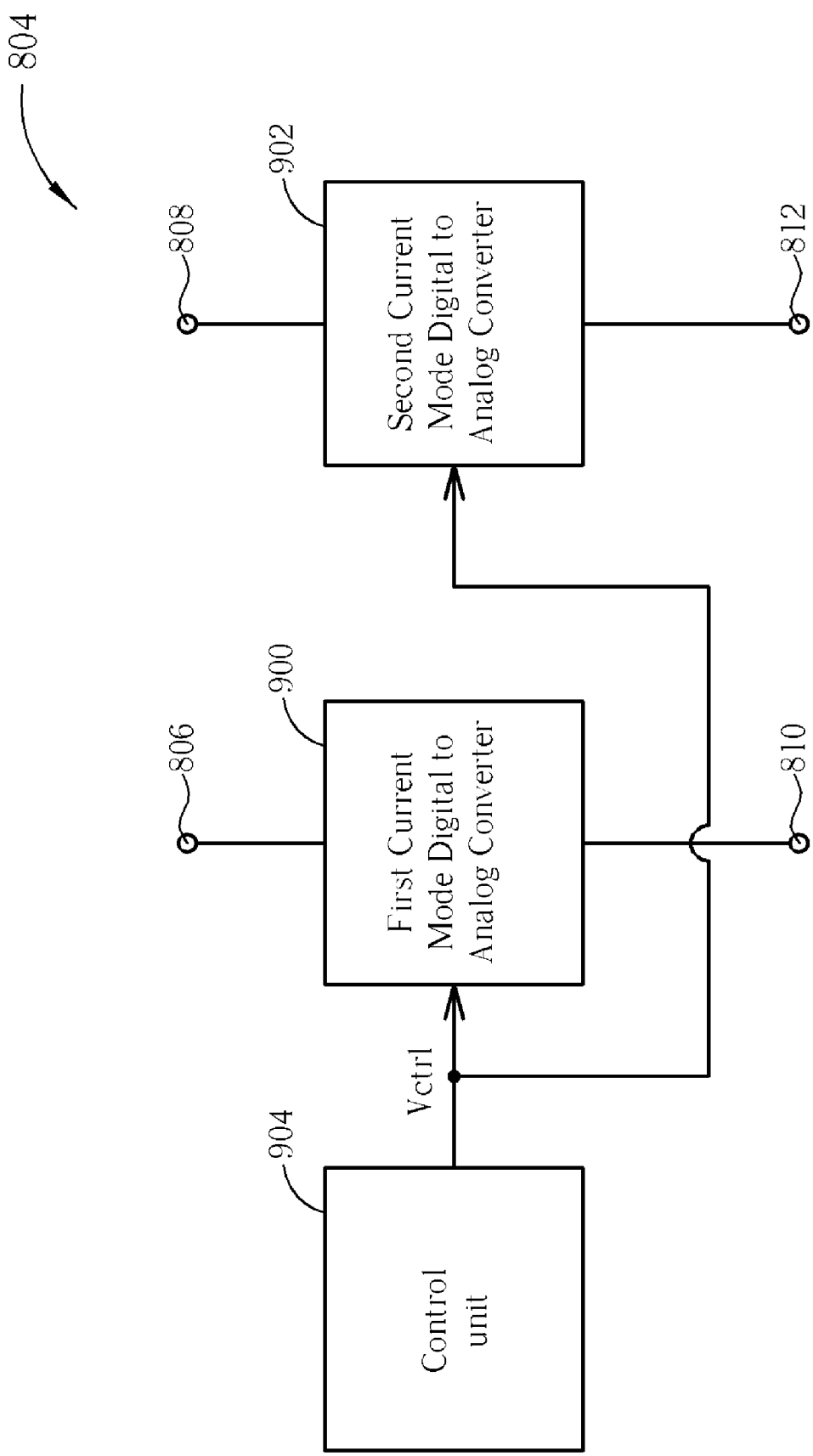
FIG. 10 illustrates a schematic diagram of the trimming device shown in FIG. 8.

Please further refer to FIG. 10, which illustrates a schematic diagram of the trimming device 804. Similar to the trimming device 304 of FIG. 4, the trimming device 804 also comprises a first current mode DAC 900, a second current mode DAC 902, and a control unit 904. The first current mode DAC 900 is coupled between the first current output end 806 and the first current reception end 810, for outputting current through the first current output end 806 and receiving current through the first current reception end 810 according to the control signal Vctrl outputted from the control unit 904. The second current mode DAC 902 is coupled between the second current output end 808 and the second current reception end 812, for outputting current through the second current output end 808 and receiving current through the second current reception end 812 according to the control signal Vctrl outputted from the control unit 904. Hence, when the current Id1 does not equal Id2 and Id3 does not equal Id4 due to the offset voltage of the rail to rail operational amplifier 80, the control unit 904 can control the first current mode DAC 900 and the second current mode DAC 902 through the control signal Vctrl, so as to adjust the current inputted to the output stage circuit 802 and the current inputted to the input stage circuit 800. In this case, the offset voltage effect can be compensated effectively.

Figure 11:
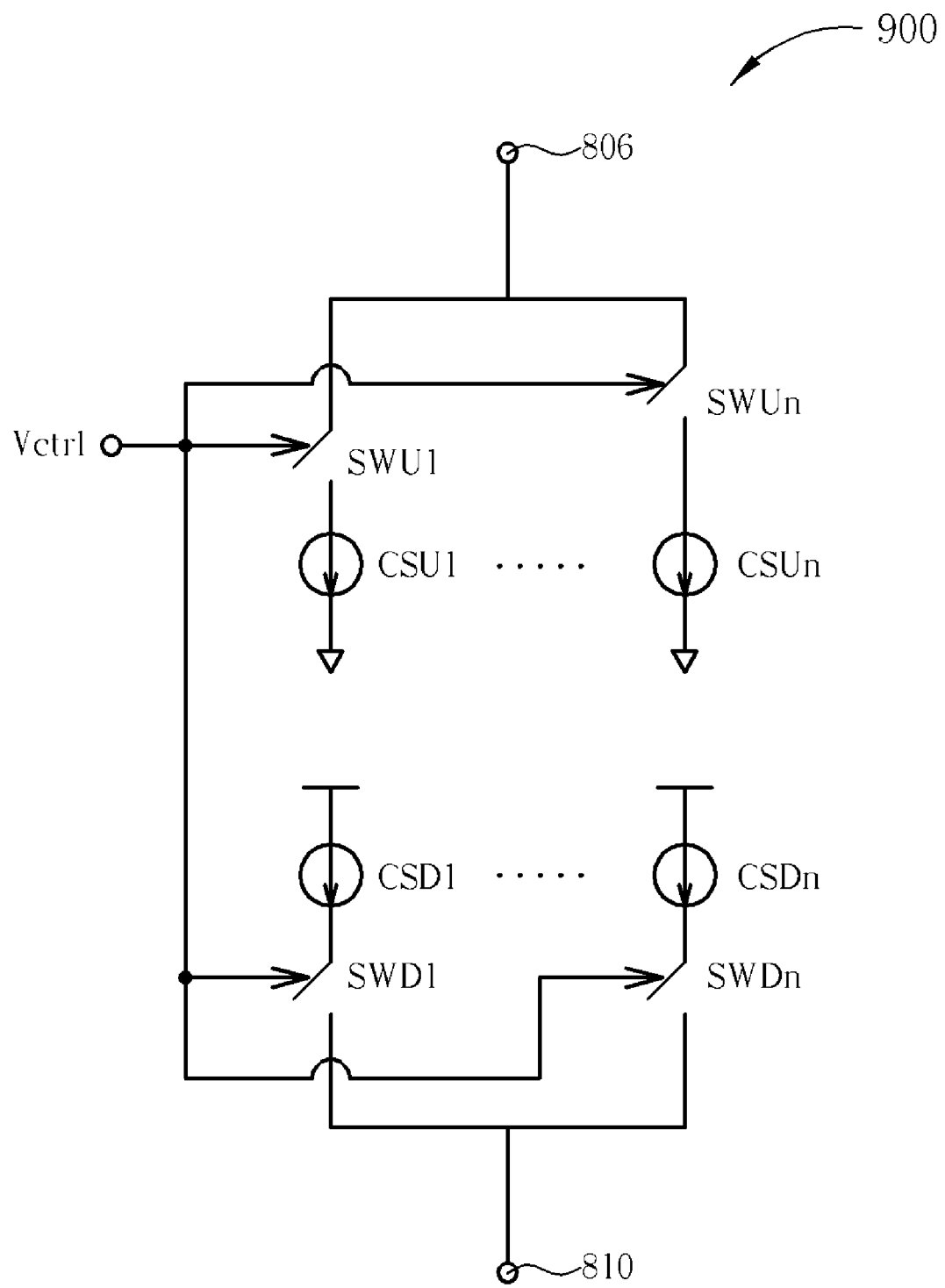
FIG. 11 illustrates a schematic diagram of the first current mode digital to analog converter shown in FIG. 10.

Certainly, the trimming device 804 can be any device that has the same function. For example, as shown in FIG. 11, the first current mode DAC 900 can be composed of switches SWU1~SWUn, SWD1~SWDn and current sources CSU1~CSUn, CSD1~CSDn. The switches SWU1~SWUn can conduct connection between the first current output end 806 and a corresponding current source according to the control signal Vctrl, so as to adjust the current amount outputted from the input stage circuit 800 through the first current output end 806. The switches SWD1~SWDn can conduct connection between the first current reception end 810 and a corresponding current source according to the control signal Vctrl, so as to adjust the current amount received by the input stage circuit 800 through the first current reception end 810. The second current mode DAC 902 can also be realized according to the framework in FIG. 11. In this way, the control unit 904 can make the current Id1 approach or equal to the current Id2, and make the current Id3 approach or equal to the current Id4 through the control signal Vctrl, so that the offset voltage effect can be compensated effectively. Of course, the number of current sources CSU1~CSUn, CSD1~CSDn can be adjusted according to the required accuracy, and currents from each of the current source can be set as identical or stepping reduction.

In summary, the present invention compensates the offset voltage effect by adjusting the current amount between the input stage circuit and the output stage circuit of the operational amplifier. Therefore, without changing the input stage circuit and the output stage circuit, the present invention can compensate the offset voltage effect, and thus improve the circuit performances.

Those skilled in the art will readily observe that numerous modifications and alterations of the device and method may be made while retaining the teachings of the invention.

What is claimed is:

1. An operational amplifier capable of compensating offset voltage comprising:
    an input stage circuit comprising a positive input end, a negative input end, a first current output end, and a second current output end, for outputting currents from the first current output end and the second current output end according to voltage received from the positive input end and the negative input end;
    an output stage circuit coupled to the first current output end and the second current output end, for outputting voltage according to the currents outputted from the first current output end and the second current output end; and
    a trimming device, comprising:
        a first current-mode digital to analog converter (DAC) coupled to the first current output end, for outputting or receiving current through the first current output end according to a control signal;
        a second current-mode DAC coupled to the second current output end, for outputting or receiving current through the second current output end according to the control signal; and
        a control unit coupled to the first current-mode DAC and the second current-mode DAC, for outputting the control signal according to a current difference between the first current output end and the second output end, for controlling a current amount outputted or received by the first current-mode DAC through the first current output end, and a current amount outputted or received by the second current-mode DAC through the second current output end.

2. The operational amplifier of claim 1, wherein the input stage circuit comprises:
- a current source;
- a first transistor comprising a drain coupled to the first current output end, a source coupled to the current source, and a gate coupled to the positive input end; and
- a second transistor comprising a drain coupled to the second current output end, a source coupled to the current source, and a gate coupled to the negative input end.

3. The operational amplifier of claim 2, wherein the first transistor and the second transistor are both p-type metal oxide semiconductor transistors.

4. The operational amplifier of claim 2, wherein the first transistor and the second transistor are both n-type metal oxide semiconductor transistors.

5. The operational amplifier of claim 1, wherein the first current-mode DAC comprises:
- a plurality of current sources; and
- a plurality of switches each comprising a first end coupled to the first current output end, a second end coupled to the control unit, and a third end coupled to a current source of the plurality of current sources, for controlling a connection between the first end and the third end according to the control signal received by the second end.

6. The operational amplifier of claim 5, wherein current amounts outputted by the plurality of current sources are identical.

7. The operational amplifier of claim 5, wherein current amounts outputted by the plurality of current sources are in a step relationship.

8. The operational amplifier of claim 1, wherein the second current-mode DAC comprises:
- a plurality of current sources; and
- a plurality of switches each comprising a first end coupled to the second current output end, a second end coupled to the control unit, and a third end coupled to a current source of the plurality of current sources, for controlling a connection between the first end and the third end according to the control signal received by the second end.

9. The operational amplifier of claim 8, wherein current amounts outputted by the plurality of current sources are identical.

10. The operational amplifier of claim 8, wherein current amounts outputted by the plurality of current sources are in a step relationship.

11. A rail to rail operational amplifier capable of compensating offset voltage comprising:
- an input stage circuit comprising a positive input end, a negative input end, a first current output end, a second current output end, a first current reception end, and a second current reception end, for outputting currents through the first current output end and the second current output end, and for receiving currents through the first current reception end and the second current reception end according to voltages received by the positive input end and the negative input end;
- an output stage circuit coupled to the first current output end, the second current output end, the first current reception end, and the second current reception end, for generating voltage according to current of the first current output end, the second current output end, the first current reception end or the second current reception end; and
- a trimming device, comprising:
  - a first current-mode digital to analog converter (DAC) coupled between the first current output end and the first current reception end, for outputting or receiving current through the first current output end or the first current reception end according to a control signal;
  - a second current-mode DAC coupled between the second current output end and the second current reception end, for outputting or receiving current through the second current output end or the second current reception end according to the control signal; and
  - a control unit coupled to the first current-mode DAC and the second current-mode DAC, for outputting the control signal according to a current difference between the first current output end and the second current output end and a current difference between the first current reception end and the second current reception end, so as to control a current amount outputted or received by the first current-mode DAC through the first current output end or the first current reception end, and to control a current amount outputted or received by the second current-mode DAC through the second current output end or the second current reception end.

12. The rail to rail operational amplifier of claim 11, wherein the input stage circuit comprises:
- a first current source;
- a first transistor comprising a drain coupled to the first current output end, a source coupled to the first current source, and a gate coupled to the positive input end;
- a second transistor comprising a drain coupled to the second current output end, a source coupled to the first current source, and a gate coupled to the negative input end;
- a second current source;
- a third transistor comprising a drain coupled to the first current reception end, a source coupled to the second current source, and a gate coupled to the positive input end; and
- a forth transistor comprising a drain coupled to the second current reception end, a source coupled to the second current source, and a gate coupled to the negative input end.

13. The rail to rail operational amplifier of claim 12, wherein the first transistor and the second transistor are both p-type metal oxide semiconductor transistors, while the third transistor and the forth transistor are both n-type metal oxide semiconductor transistors.

14. The rail to rail operational amplifier of claim 11, wherein the first current-mode DAC comprises:
- a plurality of first current sources;
- a plurality of first switches each comprising a first end coupled to the first current output end, a second end coupled to the control unit, and a third end coupled to a first current source of the plurality of first current sources, for controlling a connection between the first end and the third end according to the control signal received by the second end;
- a plurality of second current sources;
- a plurality of second switches each comprising a first end coupled to the first current reception end, a second end coupled to the control unit, and a third end coupled to a second current source of the plurality of second current sources, for controlling a connection between the first end and the third end according to the control signal received by the second end.

15. The rail to rail operational amplifier of claim 14, wherein current amounts outputted by the plurality of first current sources are identical.

16. The rail to rail operational amplifier of claim 14, wherein current amounts outputted by the plurality of first current sources are in a step relationship.

17. The rail to rail operational amplifier of claim 14, wherein current amounts outputted by the plurality of second current sources are identical.

18. The rail to rail operational amplifier of claim 14, wherein current amounts outputted by the plurality of second current sources are in a step relationship.

19. The rail to rail operational amplifier of claim 11, wherein the second current-mode DAC comprises:
  a plurality of first current sources;
  a plurality of first switches each comprising a first end coupled to the second current output end, a second end coupled to the control unit, and a third end coupled to a first current source of the plurality of first current sources, for controlling a connection between the first end and the third end according to the control signal received by the second end;
  a plurality of second current sources;
  a plurality of second switches each comprising a first end coupled to the second current reception end, a second end coupled to the control unit, and a third end coupled to a second current source of the plurality of second current sources, for controlling a connection between the first end and the third end according to the control signal received by the second end.

20. The rail to rail operational amplifier of claim 19, wherein current amounts outputted by the plurality of first current sources are identical.

21. The rail to rail operational amplifier of claim 19, wherein current amounts outputted by the plurality of first current sources are in a step relationship.

22. The rail to rail operational amplifier of claim 19, wherein current amounts outputted by the plurality of second current sources are identical.

23. The rail to rail operational amplifier of claim 19, wherein current amounts outputted by the plurality of second current sources are in a step relationship.

* * * * *